(12) United States Patent
Corneille et al.

(10) Patent No.: US 10,026,859 B2
(45) Date of Patent: Jul. 17, 2018

(54) SMALL GAUGE WIRE SOLAR CELL INTERCONNECT

(75) Inventors: Jason S. Corneille, San Jose, CA (US); Anil Vijayendran, San Jose, CA (US); Todd A. Krajewski, Mountain View, CA (US)

(73) Assignee: BEIJING APOLLO DING RONG SOLAR TECHNOLOGY CO., LTD., Beijing (CN)

( * ) Notice: Subject to any disclaimer, the term of this patent is extended or adjusted under 35 U.S.C. 154(b) by 970 days.

(21) Appl. No.: 12/897,162

(22) Filed: Oct. 4, 2010

(65) Prior Publication Data

US 2012/0080079 A1  Apr. 5, 2012

(51) Int. Cl.
  *H01L 31/00* (2006.01)
  *H01L 31/05* (2014.01)

(52) U.S. Cl.
  CPC ...... *H01L 31/0508* (2013.01); *H01L 31/0512* (2013.01); *Y02E 10/50* (2013.01)

(58) Field of Classification Search
  CPC .................. H01L 31/0508; H01L 31/0512
  See application file for complete search history.

(56) References Cited

U.S. PATENT DOCUMENTS

| | | |
|---|---|---|
| 2,782,809 A | 2/1957 | Smallridge |
| 2,963,048 A | 12/1960 | Smith |
| 3,025,889 A | 3/1962 | Clay |
| 3,376,164 A | 4/1968 | Bachwansky |
| 3,459,391 A | 8/1969 | Haynos |
| 3,553,030 A | 1/1971 | Lebrun |
| 3,561,500 A | 2/1971 | Rentz et al. |
| 3,713,893 A | 1/1973 | Shirland |
| 4,017,332 A | 4/1977 | James |
| 4,019,924 A | 4/1977 | Kurth |
| 4,166,918 A | 9/1979 | Nostrand et al. |
| 4,346,159 A | 8/1982 | Sadamatsu et al. |
| 4,366,335 A | 12/1982 | Feng et al. |
| 4,367,581 A | 1/1983 | Kohler |

(Continued)

FOREIGN PATENT DOCUMENTS

| | | |
|---|---|---|
| CA | 2335159 | 12/1999 |
| CA | 2718518 | 9/2009 |

(Continued)

OTHER PUBLICATIONS

Huisman et al, The application of inverse titania opals in nanostructured solar cells, Jun. 1, 2004, Elsevier, Solar Energy Material & solar Cells 85 (2005), pp. 115-124.*

(Continued)

*Primary Examiner* — Shannon Gardner
(74) *Attorney, Agent, or Firm* — Weaver Austin Villeneuve & Sampson LLP (57) ABSTRACT

Disclosed are wire assemblies for solar cells. One wire assembly includes a first polymer film and a second polymer film overlaying the first polymer film. The second polymer film has a wire embedded in it such that a surface of the wire that is facing away from the first polymer film is exposed. The gauge of the wire is about 36 to 46 gauge. The thickness of the second polymer film is about ¼ to ½ the diameter of the wire and about 0.5 to 1.5 mils.

18 Claims, 9 Drawing Sheets

(56) References Cited

U.S. PATENT DOCUMENTS

| | | | |
|---|---|---|---|
| 4,499,658 A * | 2/1985 | Lewis | B32B 17/10697 136/251 |
| 4,560,498 A | 12/1985 | Horsma et al. | |
| 4,567,642 A | 2/1986 | Dilts et al. | |
| 4,574,160 A | 3/1986 | Cull et al. | |
| 4,598,306 A | 7/1986 | Nath et al. | |
| 4,640,002 A | 2/1987 | Phillips et al. | |
| 4,652,693 A | 3/1987 | Bar-On | |
| 4,694,117 A | 9/1987 | Friedrich et al. | |
| 4,849,133 A | 7/1989 | Yoshida et al. | |
| 5,034,068 A | 7/1991 | Glenn et al. | |
| 5,158,618 A | 10/1992 | Rubin et al. | |
| 5,330,583 A | 7/1994 | Asai et al. | |
| 5,391,235 A | 2/1995 | Inoue | |
| 5,474,621 A | 12/1995 | Barnard | |
| 5,554,229 A | 9/1996 | Vogeli | |
| 5,620,528 A | 4/1997 | Schade et al. | |
| 5,626,688 A | 5/1997 | Probst et al. | |
| 5,681,402 A | 10/1997 | Ichinose et al. | |
| 5,759,291 A | 6/1998 | Ichinose et al. | |
| 5,814,195 A | 9/1998 | Lehan et al. | |
| 5,861,324 A | 1/1999 | Ichinose et al. | |
| 6,093,581 A | 7/2000 | Takabayashi | |
| 6,093,884 A | 7/2000 | Toyomura et al. | |
| 6,114,046 A | 9/2000 | Hanoka | |
| 6,121,542 A | 9/2000 | Shiotsuka et al. | |
| 6,132,585 A | 10/2000 | Midorikawa et al. | |
| 6,184,457 B1 | 2/2001 | Tsuzuki et al. | |
| 6,184,458 B1 | 2/2001 | Murakami et al. | |
| 6,231,732 B1 | 5/2001 | Hollars et al. | |
| 6,232,544 B1 | 5/2001 | Takabayashi | |
| 6,335,479 B1 | 1/2002 | Yamada et al. | |
| 6,365,010 B1 | 4/2002 | Hollars | |
| 6,372,538 B1 | 4/2002 | Wendt et al. | |
| 6,479,744 B1 | 11/2002 | Tsuzuki et al. | |
| 6,488,824 B1 | 12/2002 | Hollars et al. | |
| 6,531,653 B1 | 3/2003 | Glenn et al. | |
| 6,548,912 B1 | 4/2003 | Graff et al. | |
| 6,600,100 B2 | 7/2003 | Ho et al. | |
| 6,657,119 B2 | 12/2003 | Lindquist et al. | |
| 6,743,524 B2 | 6/2004 | Schaepkens | |
| 6,803,513 B2 | 10/2004 | Beernink et al. | |
| 6,974,976 B2 | 12/2005 | Hollars | |
| 7,544,884 B2 | 6/2009 | Hollars | |
| 8,138,413 B2 * | 3/2012 | Luch et al. | 136/244 |
| 8,142,601 B2 | 3/2012 | Sugimoto | |
| 8,356,324 B2 | 1/2013 | Rajakarunanayake | |
| 8,356,640 B1 | 1/2013 | Nizenkoff et al. | |
| 8,912,429 B2 | 12/2014 | Wudu et al. | |
| 8,951,824 B1 | 2/2015 | Krajewski | |
| 9,061,344 B1 | 6/2015 | Mckay et al. | |
| 9,620,660 B2 | 4/2017 | Wudu et al. | |
| 2002/0014262 A1 | 2/2002 | Matsushita et al. | |
| 2002/0166580 A1 | 11/2002 | Bauman et al. | |
| 2004/0063320 A1 | 4/2004 | Hollars | |
| 2004/0069340 A1 | 4/2004 | Luch | |
| 2004/0118448 A1 | 6/2004 | Scher et al. | |
| 2004/0144043 A1 | 7/2004 | Stevenson et al. | |
| 2004/0187917 A1 | 9/2004 | Pichler | |
| 2005/0072461 A1 | 4/2005 | Kuchinski et al. | |
| 2005/0074915 A1 | 4/2005 | Tuttle et al. | |
| 2005/0109392 A1 | 5/2005 | Hollars | |
| 2005/0176270 A1 | 8/2005 | Luch | |
| 2005/0241692 A1 * | 11/2005 | Rubin et al. | 136/256 |
| 2005/0274408 A1 | 12/2005 | Li et al. | |
| 2006/0032752 A1 | 2/2006 | Luch | |
| 2006/0180195 A1 | 8/2006 | Luch | |
| 2006/0207646 A1 | 9/2006 | Terreau | |
| 2007/0283996 A1 | 12/2007 | Hachtmann et al. | |
| 2007/0283997 A1 | 12/2007 | Huchtmann et al. | |
| 2007/0295385 A1 | 12/2007 | Sheats et al. | |
| 2007/0295390 A1 * | 12/2007 | Sheats | B32B 17/1077 136/251 |
| 2008/0000518 A1 | 1/2008 | Basol | |
| 2008/0011350 A1 | 1/2008 | Luch | |
| 2008/0053511 A1 | 3/2008 | Nakamura | |
| 2008/0053519 A1 | 3/2008 | Pearce et al. | |
| 2008/0128018 A1 | 6/2008 | Hayes | |
| 2008/0142071 A1 | 6/2008 | Dorn et al. | |
| 2008/0213477 A1 | 6/2008 | Zindel et al. | |
| 2008/0314432 A1 | 12/2008 | Paulson et al. | |
| 2008/0314433 A1 | 12/2008 | Luch | |
| 2009/0014049 A1 | 1/2009 | Gur et al. | |
| 2009/0014057 A1 | 1/2009 | Croft et al. | |
| 2009/0014058 A1 | 1/2009 | Croft et al. | |
| 2009/0111206 A1 | 4/2009 | Luch | |
| 2009/0199894 A1 | 8/2009 | Hollars et al. | |
| 2009/0235979 A1 * | 9/2009 | Wudu | H01L 31/02242 136/256 |
| 2009/0297803 A1 | 12/2009 | Kriha et al. | |
| 2010/0043863 A1 | 2/2010 | Wudu et al. | |
| 2010/0108122 A1 | 5/2010 | Everson et al. | |
| 2010/0122730 A1 | 5/2010 | Corneille et al. | |
| 2010/0130348 A1 | 5/2010 | Kang et al. | |
| 2010/0212733 A1 | 8/2010 | Schmidt et al. | |
| 2011/0143077 A1 | 6/2011 | Kakihara et al. | |
| 2011/0197947 A1 | 8/2011 | Croft et al. | |
| 2011/0207328 A1 | 8/2011 | Speakman | |
| 2012/0000510 A1 | 1/2012 | Wiedeman et al. | |
| 2012/0080079 A1 | 4/2012 | Corneille et al. | |
| 2012/0125393 A1 | 5/2012 | Austin et al. | |
| 2012/0138117 A1 | 6/2012 | Krajewski | |
| 2013/0276855 A1 | 10/2013 | Wudu et al. | |
| 2015/0136119 A1 | 5/2015 | Wudu et al. | |
| 2016/0190369 A1 | 6/2016 | Krajewski | |
| 2016/0204302 A1 | 7/2016 | Croft | |
| 2017/0047464 A1 | 2/2017 | Krajewski | |

FOREIGN PATENT DOCUMENTS

| | | |
|---|---|---|
| DE | 2757301 | 7/1979 |
| DE | 2919041 | 11/1980 |
| DE | 10393252 T5 | 9/2005 |
| EP | 0440869 | 8/1991 |
| EP | 0949686 | 10/1999 |
| EP | 1868250 | 5/2010 |
| JP | 60128647 A | 7/1985 |
| JP | 06-021501 | 1/1994 |
| JP | 07-099334 | 4/1995 |
| JP | 09-036404 | 2/1997 |
| JP | 10-093125 | 4/1998 |
| JP | 2000-269531 | 9/2000 |
| JP | 2004-253475 | 9/2004 |
| JP | 2005-129773 | 5/2005 |
| JP | 2006-041351 | 2/2006 |
| KR | 10-1999-006965 | 1/1999 |
| KR | 10-0242852 | 2/2000 |
| WO | 2007116806 | 10/2007 |
| WO | 2009/117233 | 9/2009 |
| WO | 2010/056803 | 5/2010 |
| WO | 2012/047553 | 4/2012 |

OTHER PUBLICATIONS

Reynolds, Phillip John, A Surlyn Ionomer as a self-healing and self-sensing composite, Dec. 2011, University of Bormingham, p. 10.*

Sigma-Aldrich, Material Saftey Data Sheet poly (ethylene terephthalate), Dec. 18, 2012, Sigma-Aldrich, Version 4.2.*

Sigma-Aldrich, Material Safety Data Sheet poly(ethylene-co-matheacrylic acid), Jul. 20, 2010, Sigma-Aldrich, Version 4.0.*

DuPont Surlyn resins Product Data Sheet, accessed Jun. 30, 2016; http://www.dupont.com/content/dam/dupont/products-and-services/packaging-materials-and-solutions/packaging-materials-and-solutions-landing/documents/surlyn_1652.pdf.*

Richards et al., "Enhancing the efficiency of production CdS/CdTe PV modules by overcoming poor spectral response at short wavelengths via luminescence downshifting," 2006 IEEE 4th World Conference on Photovoltaic Energy Conversion, May 7-12, 2006, 4 pages.

(56) References Cited

OTHER PUBLICATIONS

Untila et al., "19.2% Efficient Bifacial ITO-(P+Nn+)Si-ITO Laminated Grid Cell", 16th European Photovoltaic Solar Energy Conference, May 1-5, 2000, Glasgow, UK, pp. 1489-1491.
U.S. Appl. No. 11/451,616, "Photovoltaic module with integrated current collection and interconnection", Hachtmann et al., filed Jun. 13, 2006.
U.S. Appl. No. 11/451,604, "Photovoltaic module with insulating interconnect carrier," Hachtmann et al., filed Jun. 13, 2006.
U.S. Appl. No. 11/451,604, Final Office Action dated Apr. 1, 2010.
U.S. Appl. No. 11/451,604, Office Action dated Sep. 4, 2009.
EP patent application No. 07252359.0, Examination Report dated Jul. 10, 2008.
U.S. Appl. No. 12/052,476, "Interconnect assembly," Zerfu et al., filed Mar. 20, 2008.
WO patent application No. PCT/US2009/035486, International Search Report and Written Opinion, dated Sep. 29, 2009.
U.S. Appl. No. 12/566,555, "Interconnect Assembly", Wudu et al., filed Sep. 24, 2009.
U.S. Appl. No. 12/272,600, "Power-loss-inhibiting current-collector", Corneille et al., filed Nov. 17, 2008.
U.S. Appl. No. 12/837,867, "Transparent conductive film-coated decals for solar cells", Corneille et al., filed Jul. 16, 2010.
U.S. Appl. No. 12/819,124, "Power-loss-inhibiting current collector having transparent current regulator", Corneille et al., filed Jun. 18, 2010.
U.S. Appl. No. 12/843,648, "Temperature resistant current collectors for thin film photovoltaic cells", Alex Austin, filed Jul. 26, 2010.
US patent application No. PCT/US2009/064125, International Search Report and Written Opinion, dated May 24, 2010.
U.S. Appl. No. 12/272,600, Office Action dated Apr. 14, 2011.
U.S. Appl. No. 12/052,476, Office Action dated Jan. 21, 2011.
U.S. Appl. No. 12/052,476, Office Action dated Aug. 3, 2011.
U.S. Appl. No. 12/272,600, Office Action dated Oct. 18, 2011.
U.S. Appl. No. 12/687,754, "Apparatuses and methods for fabricating wire current collectors and interconnects for solar cells", Nizenkoff et al., filed Jan. 14, 2010.
U.S. Appl. No. 12/915,882, "Apparatus and method for securing wire to decal", McKay et al., filed Oct. 29, 2010.
U.S. Appl. No. 13/082,709, "Adhesives for attaching wire network to photovoltaic cells", Todd Krajewski, filed Apr. 8, 2011.
U.S. Appl. No. 13/085,274, "Thermoplastic wire network support for photovoltaic cells", Todd Krajewski, Apr. 12, 2011.
U.S. Appl. No. 13/087,724, "Wire network for interconnecting photovoltaic cells", Steven Croft, filed Apr. 15, 2011.
U.S. Appl. No. 13/087,730, "Interconnecting wire network with conductive tab", Steven Croft, filed Apr. 15, 2011.
U.S. Appl. No. 11/451,616, Office Action dated Sep. 17, 2009.
U.S. Appl. No. 11/451,616, Final Office Action dated Apr. 20, 2010.
U.S. Appl. No. 12/951,711, "Photovoltaic Device and Method and System for Making Photovoltaic Device," Austen, filed Nov. 22, 2010.
U.S. Appl. No. 12/052,476, Office Action dated Mar. 16, 2012.
U.S. Appl. No. 12/052,476, Notice of Allowance dated Jul. 18, 2012.
U.S. Appl. No. 12/566,555, Office Action dated Feb. 16, 2012.
U.S. Appl. No. 13/114,999, "Apparatuses and Methods for Fabricating wire Current Collectors and Interconnects for Solar Cells," McKay et al., filed May 24, 2011.
U.S. Appl. No. 12/915,882, Office Action dated Jul. 20, 2012.
International Search Report and Written Opinion dated Apr. 24, 2012 for application No. PCT/US2011/052974.
U.S. Appl. No. 12/837,867, Office Action dated Aug. 8, 2012.
U.S. Appl. No. 12/566,555, Office Action dated Sep. 28, 2012.
U.S. Appl. No. 12/819,124, Ofice Action dated Oct. 9, 2012.
U.S. Appl. No. 12/052,476, Office Action dated May 31, 2013.
U.S. Appl. No. 13/850,976, "Interconnect Assembly", Wudu et al., filed Mar. 26, 2013.
Notice of Allowance dated Sep. 18, 2012, for U.S. Appl. No. 12/687,754.
Office Action dated Dec. 6, 2012, for U.S. Appl. No. 12/843,648.
Shimomura, JP 2006-041351A, Machine Translation.
US Office Action dated Aug. 1, 2013, issued in U.S. Appl. No. 13/085,274.
Kay, et al. Low Cost Photovoltaic Modules Based on Dye Sensitized Nanocrystalline Titanium Dioxide and Carbon Powder, Solar Energy Materials and Solar Cells, 1996, 19 pages.
DuPont, Teflon FEP 100 Material Safety Data Sheet, 2013, 2 pages.
U.S. Appl. No. 13/082,709, Office Action dated Nov. 1, 2013.
U.S. Appl. No. 13/087,724, Office Action dated Nov. 6, 2013.
U.S. Appl. No. 12/052,476, Office Action dated Feb. 7, 2014.
U.S. Appl. No. 13/085,274, Office Action dated Apr. 11, 2014.
U.S. Appl. No. 12/052,476, Office Action dated May 2, 2014.
U.S. Appl. No. 12/687,754, Notice of Allowance dated Sep. 18, 2012.
U.S. Appl. No. 13/087,724, Final Office Action dated Jun. 12, 2014.
U.S. Appl. No. 13/082,709, Office Action dated Jun. 17, 2014.
U.S. Appl. No. 12/052,476, Notice of Allowance dated Aug. 14, 2014.
U.S. Appl. No. 13/114,999, Office Action dated Jul. 24, 2014.
U.S. Appl. No. 13/087,730, Office Action dated Jun. 25, 2014.
U.S. Appl. No. 11/451,616, Office Action dated Jun. 6, 2014.
U.S. Appl. No. 11/451,604, Office Action dated Jun. 6, 2014.
U.S. Appl. No. 14/539,876, "Interconnect Assembly," Wudu et al., filed Nov. 12, 2014.
U.S. Appl. No. 13/082,709, Notice of Allowance dated Oct. 6, 2014.
U.S. Appl. No. 13/085,274, Office Action dated Dec. 26, 2014.
U.S. Appl. No. 13/087,730, Office Action dated Feb. 5, 2015.
U.S. Appl. No. 14/616,978, "Adhesives for attaching wire network to photovoltaic cells," Todd Krajewski, filed Feb. 9, 2015.
U.S. Appl. No. 11/451,616, Final Office Action dated Feb. 2, 2015.
U.S. Appl. No. 13/850,976, "Interconnect Assembly," Wudu et al., filed Mar. 27, 2013.
U.S. Appl. No. 13/114,999, Notice of Allowance dated Feb. 20, 2015.
US Final Office Action dated Jul. 22, 2015, issued in U.S. Appl. No. 13/085,274.
U.S. Appl. No. 14/822,712, "Wire network for interconnecting photovoltaic cells", Steven Croft, filed Aug. 10, 2015.
EP Application 09721573.5, Extended Search Report dated Jul. 23, 2015.
US Office Action dated Sep. 29, 2015 in U.S. Appl. No. 13/850,976.
US Office Action dated Oct. 2, 2015 in U.S. Appl. No. 11/451,616.
US Office Action dated Jan. 22, 2016, in U.S. Appl. No. 11/451,604.
CA Office Action dated Jan. 13, 2016, in Application No. 2,718,518.
US Office Action dated Mar. 10, 2016 in U.S. Appl. No. 11/451,616.
U.S. Appl. No. 13/850,976, Notice of Allowance dated Dec. 19, 2016.
U.S. Appl. No. 12/272,600, Office Action dated Oct. 10, 2012.
US Notice of Allowance dated Jan. 6, 2017, in U.S. Appl. No. 14/616,978.
US Final Office Action dated Feb. 1, 2017, in U.S. Appl. No. 13/087,730.
EP Search Report dated Apr. 7, 2010, issued in Application No. 07252359.0.
Partial EP Search Report dated Jul. 10, 2008, issued in Application No. 07252359.0.
EP Office Action dated Jul. 13, 2010, issued in Application No. 072523359.0.
EP Extended Search Report dated Aug. 11, 2015, issued in Application No. 09721573.5.
CA Office Action and Examination Search Report dated Jan. 13, 2016, in Application No. 2,718,518.
CA Office Action and Examination Search Report dated Jun. 5, 2015, in Application No. 2,718,518.
U.S. Appl. No. 15/473,476, filed Mar. 29, 2017, Wudu et al.
U.S. Appl. No. 13/850,976, Office Action dated Jun. 6, 2016.
US Office Action dated Aug. 8, 2016, in U.S. Appl. No. 13/087,730.
US Office Action dated Jul. 29, 2016, in U.S. Appl. No. 11/451,604.
US Office Action dated Oct. 5, 2016, in U.S. Appl. No. 11/451,616.
US Office Action dated Oct. 26, 2016, in U.S. Appl. No. 14/616,978.

(56) References Cited

OTHER PUBLICATIONS

U.S. Office Action dated Apr. 19, 2018, in U.S. Appl. No. 13/087,730.

* cited by examiner

FIG. 9 ited States Patent

SMALL GAUGE WIRE SOLAR CELL INTERCONNECT

BACKGROUND

Photovoltaic cells are widely used for the generation of electricity. Multiple photovoltaic cells may be interconnected in module assemblies. Such modules may in turn be arranged in arrays and integrated into building structures or otherwise assembled to convert solar energy into electricity by the photovoltaic effect. Certain photovoltaic cell fabrication processes involve depositing thin film materials on a substrate to form a light absorbing layer sandwiched between electrical contact layers. The front or top contact is a transparent and conductive layer for current collection and light enhancement, the light absorbing layer is a semiconductor material, and the back contact is a conductive layer to provide electrical current throughout the cell.

SUMMARY

Provided herein are wire assemblies for a solar cell. The wire assemblies act as current collectors and/or interconnects for a solar cell. For example, a wire assembly acting as an interconnect allows a solar cell to be electrically connected to another solar cell. According to various embodiments, the wire assemblies include polymer films, with one polymer film having a wire embedded in it. The wire gauge is about 36 to 46 gauge. The polymer film having the wire embedded in it has a thickness such that a surface of the wire remains exposed.

In one embodiment, a wire assembly for a solar cell includes a first polymer film, a second polymer film overlaying the first polymer film, and a wire. The thickness of the first polymer film is about 0.5 to 2 mils. The thickness of the second polymer film is about ¼ to ½ a diameter of the wire and about 0.5 to 1.5 mils. The gauge of the wire is about 36 to 46 gauge. The second polymer film has the wire embedded in it such that a surface of the wire that is facing away from the first polymer film is exposed.

In another embodiment, a wire assembly for a solar cell includes a first layer of a film comprising poly(ethylene-co-methacrylic acid), a layer of a polyethylene terephthalate film overlaying the first layer, and a second layer of a film comprising poly(ethylene-co-methacrylic acid) overlaying the layer of the polyethylene terephthalate film. The wire assembly also includes a wire of about 40 gauge. The thickness of the polyethylene terephthalate film is about 2 mils. The thickness of the second layer is about 0.75 to 1.5 mils. The second layer has the wire embedded in it such that a surface of the wire that is facing towards the polyethylene terephthalate film is in contact with the polyethylene terephthalate film and a surface of the wire that is facing away from the polyethylene terephthalate film is exposed.

In a further embodiment, a wire assembly for a solar cell includes a first decal, a wire, and a second decal. Both the first and second decal include a first polymer film, a second polymer film overlaying the first polymer film, and a third polymer film overlaying the second polymer film. The thickness of the second polymer film is about 0.5 to 2 mils of the first decal and the second decal. The thickness of the third polymer film of the first decal and the second decal is about ¼ to ½ a diameter of the wire. The wire in configured in a pattern in which the wire repeatedly traverses a line and is about 36 to 46 gauge. A portion of a first side of the wire is embedded in the third polymer film of the first decal such that a second side of the wire that is facing away from the second polymer film of the first decal is exposed. A portion of the second side of the wire is embedded in the third polymer film of the second decal such that the first side of the wire that is facing away from the second polymer film of the second decal is exposed. The portion of the first side of the wire embedded in the third polymer film of the first decal and the portion of the second side of the wire embedded in the third polymer film of the second decal overlap in a region such that the wire in the region is embedded in the third polymer film of the first decal and the second decal.

These and other aspects of the invention are described further below with reference to the figures.

BRIEF DESCRIPTION OF THE DRAWINGS

The accompanying drawings, which are incorporated in and form part of the specification, illustrate embodiments of the invention and, together with the detailed description, serve to explain the embodiments of the invention.

The drawings referred to in this description should not be understood as being drawn to scale except if specifically noted.

DETAILED DESCRIPTION

Reference will now be made in detail to specific embodiments of the invention. Examples of the specific embodiments are illustrated in the accompanying drawings. While the invention will be described in conjunction with these specific embodiments, it will be understood that it is not intended to limit the invention to such specific embodiments. On the contrary, it is intended to cover alternatives, modifications, and equivalents as may be included within the spirit and scope of the invention. For example, while the description below refers chiefly to configurations of current collectors and/or interconnects for use in solar cells, the assemblies herein are not so limited and extend to current collectors and/or interconnects in other fields. In the following description, numerous specific details are set forth in order to provide a thorough understanding of the present invention. The present invention may be practiced without some or all of these specific details. In other instances, well known mechanical apparatuses and/or process operations have not been described in detail in order not to unnecessarily obscure the present invention.

Figure 1:
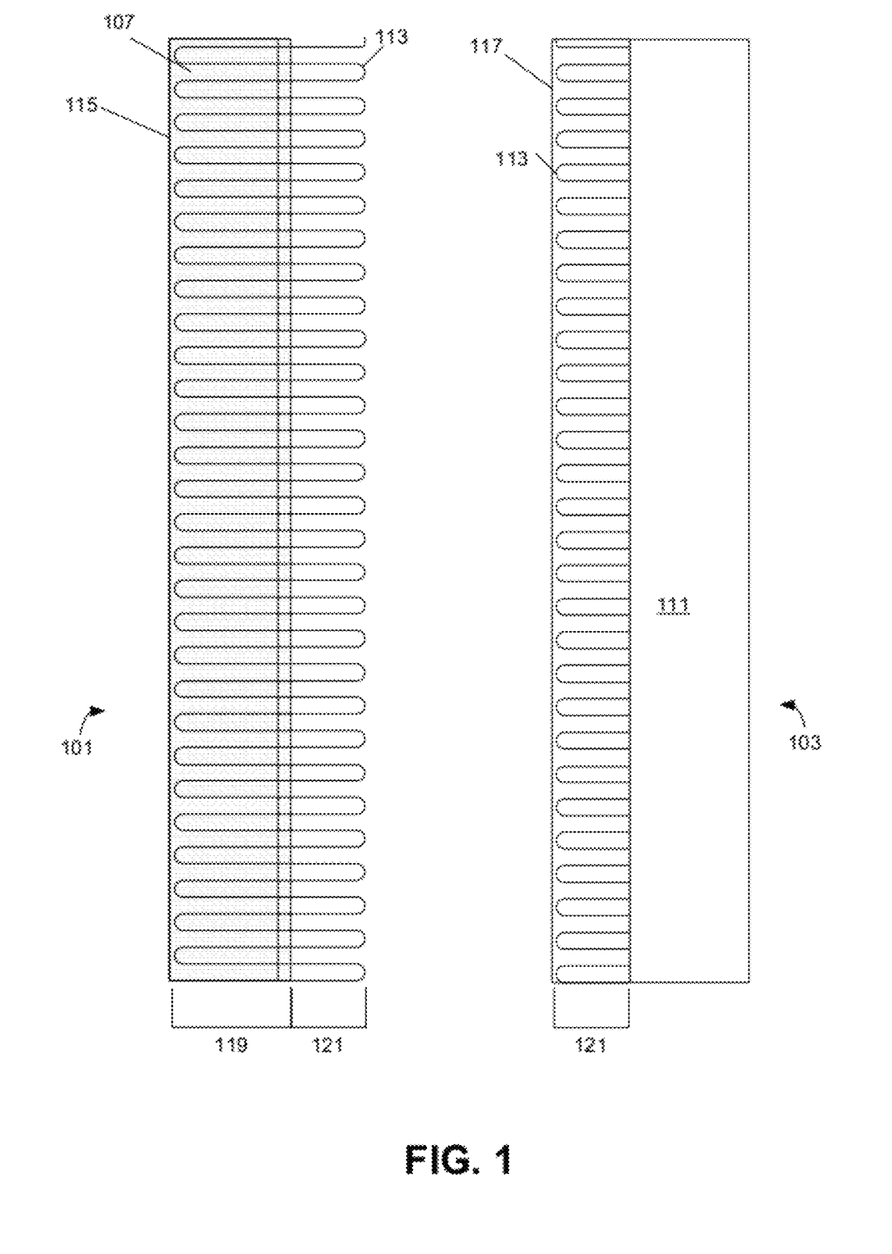
FIG. 1 depicts front and back views of a solar cell including a current collector and an interconnect wire according to certain embodiments.
Figure 2:
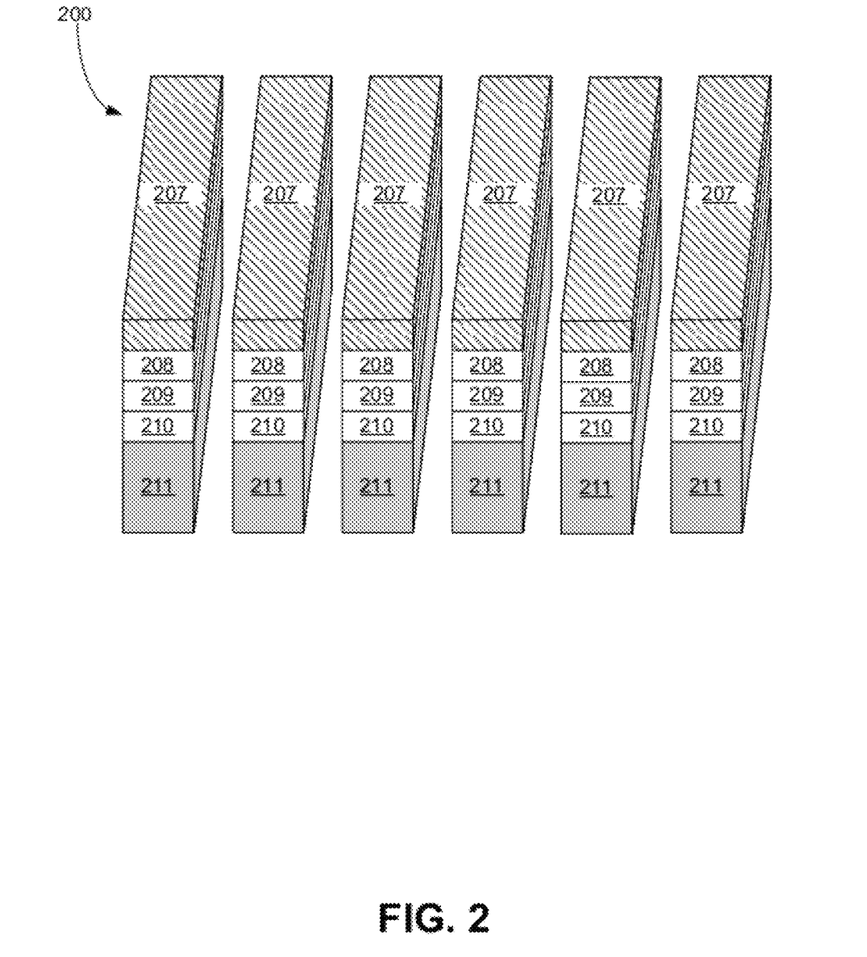
FIG. 2 is a schematic illustration of thin film solar cell stacks according to certain embodiments.

The below description presents wire assemblies including a decal and a wire, according to various embodiments. The invention is not limited to the particular examples presented below however, and it will be apparent to one of skill in the art that certain changes and modifications may be made without departing from the scope of the invention.

Provided herein are configurations of current collectors and/or interconnects for use in solar cells. FIG. 1 shows front (101) and back (103) views of a thin film solar cell, including a wire current collector/interconnect assembly. Front view 101 shows the front, or light facing, side of the solar cell including a conductive transparent top layer 107, and back view 103 shows a metallic substrate 111 supporting a thin film solar cell stack. An example of a thin film solar cell stack is depicted in FIG. 2, which shows a perspective view of cell-width strips 200 of thin film solar cell stacks. Substrate 211 supports thin films 210, 209, 208 and 207. Layers 208 and 209 form a p-n junction, with a p-type semiconductor layer 209 deposited on a back electrical contact layer 210 and a n-type semiconductor layer 208 deposited on p-type semiconductor layer 209 to complete a p-n junction. According to various embodiments, any suitable semiconductor material such as CIGS (copper indium gallium selenide), CIS (copper indium selenide), CdTe, CdS, ZnS, ZnO, amorphous silicon, polycrystalline silicon, etc. are used for layers 208 and 209. For example, the p-type semiconductor layer 209 is CIGS or CIS, and the n-type semiconductor layer 208 is CdS or a cadmium free material, such as ZnS, ZnO, etc. Top electrode layer 207 overlays the p-n junction. Top electrode layer 207 is transparent, allowing light to reach light absorbing layer 209. In certain embodiments, top electrode layer 207 is a transparent conducting oxide (TCO), for example, zinc oxide, aluminum-doped zinc oxide (AZO), indium tin oxide (ITO), and gallium doped zinc oxide. Back electrical contact layer 210 provides electrical contact to allow electrical current to flow through the solar cell, and may be made of any appropriate material, e.g., molybdenum, niobium, copper, silver, etc. As indicated above, in certain embodiments, substrate 211 is a metallic substrate, e.g., a thin stainless steel foil, though it may also be other metals including, but not limited to, titanium, copper, aluminum, beryllium, and the like. The substrate 211 may be relatively thin, less than or equal to about 2 to 10 mils (a mil is a thousandth of an inch, i.e., 1/1000 inch) in some instances, though other suitable thicknesses may also be used. In many cases the substrate is thin enough to be flexible. As indicated, the stacks 200 shown in FIG. 2 are long cell-width strips, which may be cut further to define individual cells as shown in FIG. 1. The thin film solar cells stacks shown in FIG. 2 are provided for context and not intended to be limiting. For example, the wire current collectors and/or interconnects described herein may be used with other types of solar cells as well as in other fields.

Returning to FIG. 1, the wire assembly includes serpentine wire 113 and wire carriers or decals 115 and 117. In FIG. 1, wire 113 is in a serpentine pattern, though other patterns are within the scope of the invention. For example, in another embodiment, the wire is configured in a pattern that spans a length of a decal and traverses an edge of the decal along the length of the decal. In the depicted embodiment, wire 113 is configured as a current collector to collect current generated by the solar cell and as a solar cell interconnect to electrically connect the cell to another cell, for example, in a solar module. In other solar cell or module configurations, the wire may be configured only as a current collector or only as an interconnect.

Referring again to front view 101, a portion 119 of wire 113 overlays conductive transparent top layer 107, and collects current generated from the cell. Wire 113 is typically a thin, highly conductive metal wire. Examples of wire metals include copper, aluminum, nickel, chrome, or alloys thereof. In some embodiments, a nickel coated copper wire is used. The wire should be able to maintain the serpentine or other form without significant material strain. In certain embodiments, the wire is 24 to 56 gauge, or in particular embodiments, 32 to 56 gauge, for example 40 to 50 gauge. In specific embodiments, the wire has a gauge of 34, 36, 40, 42, 44, or 46. Front decal 115 overlays all or part of portion 119. (Back decal 117, which overlies portion 121 of wire 113, is not shown in this view for clarity). Front decal 115 is a transparent, insulating carrier for the conductive wire. Examples of decal materials include thermoplastic materials such as polyethylene terephthalate (PET), ionomer resins (e.g., poly(ethylene-co-methacrylic acid), commercially available as Surlyn™, E. I. du Pont de Nemours and Company), polyamide, polyetheretherketone (PEEK), or combinations of these.

Figure 3:
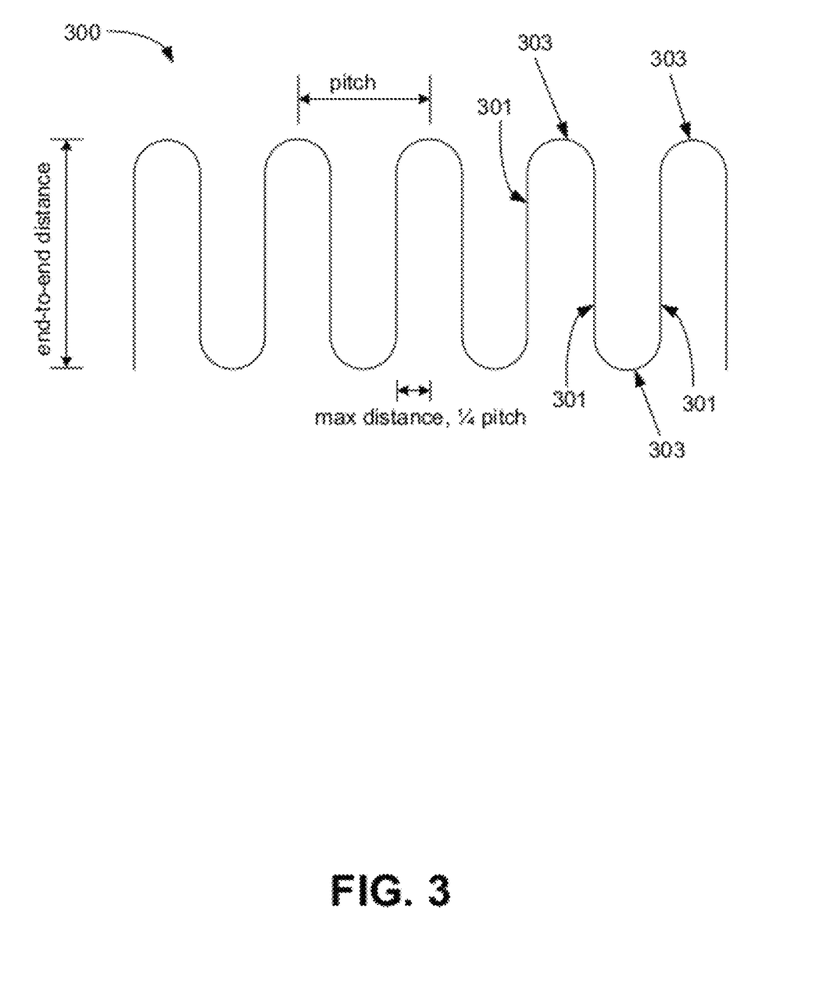
FIG. 3 is a schematic illustration of a section of a serpentine wire according to certain embodiments.

Wire 113 is significantly more conductive than the conductive transparent top layer 107 and so improves current collection. FIG. 3 shows a section 300 of a serpentine wire according to embodiments of the invention. As used herein, the term "serpentine" refers to a form having substantially uniformly spaced, substantially co-extensive and substantially parallel lengths of wire connected via substantially rounded end portions. Uniformly spaced, co-extensive, parallel lengths 301 connected by rounded end portions 303 are indicated in FIG. 3.

The pitch of the serpentine wire, as measured by the distance between the centers of adjacent end portions, determines the distance current travels through the transparent conducting oxide prior to reaching the highly conductive wire. As shown in FIG. 3, the maximum distance current has to travel through the transparent conductive oxide is ¼ pitch. Reducing the pitch increases current collection. It also decreases the useful surface area of the cell, however, by covering the light absorbing layer. In certain embodiments, the pitch is between about 4 and 10 mm, e.g., about 6.5 mm, though other distances may also be used, as appropriate.

Figure 4:
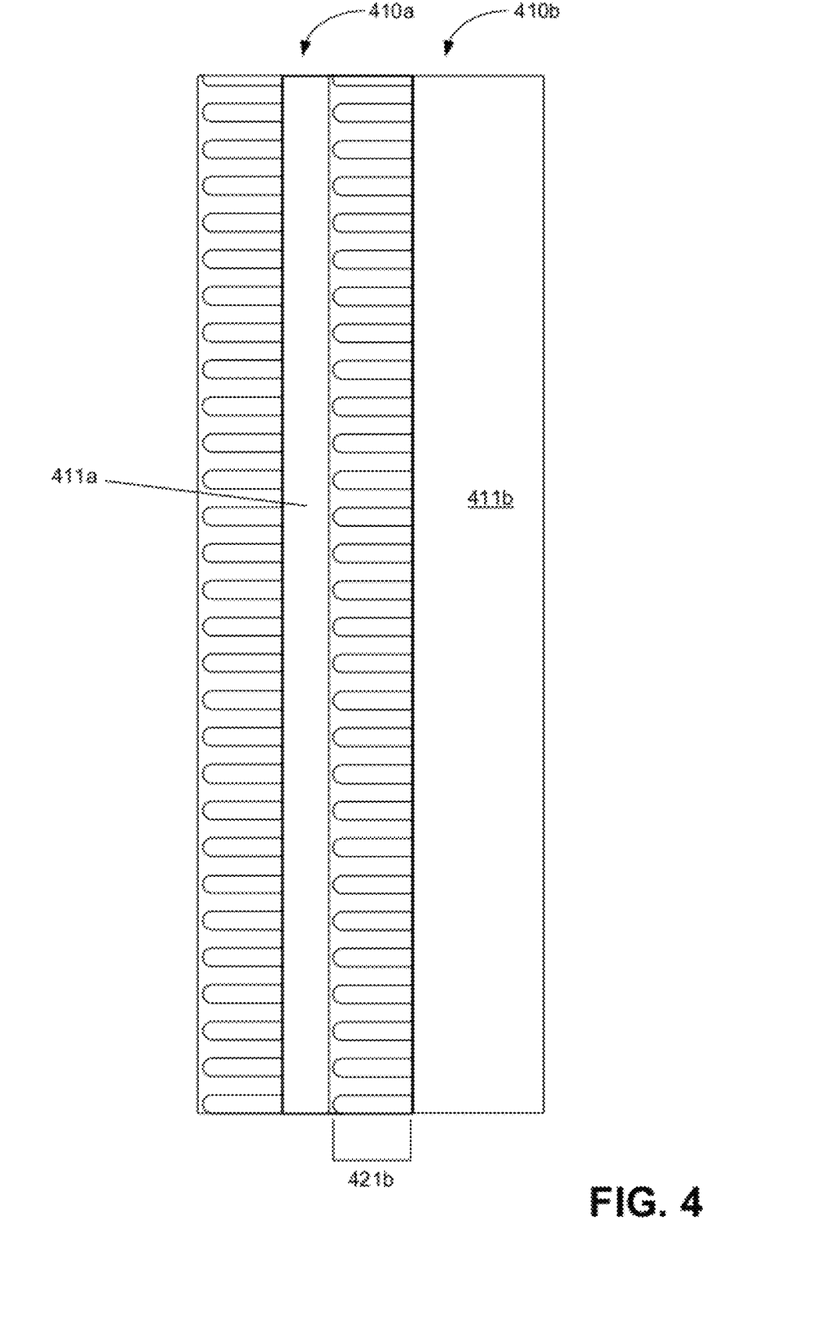
FIG. 4 depicts two interconnected solar cells according to certain embodiments.

Returning to FIG. 1, view 103 depicts metallic substrate 111 and interconnect portion 121 of serpentine wire 113. Back decal 117, which overlies portion 121 of serpentine wire 113 as shown in view 103, is an insulating carrier for serpentine wire 113. In view 103, the conductive side of interconnect portion 121 faces down, able to make contact with a metallic substrate of an adjacent cell. An example is depicted in FIG. 4, which shows the backsides of cells 410a and 410b including metallic substrates 411a and 411b. Wire interconnect 421b of cell 410b overlies metallic substrate 411a of cell 410a, thereby electrically connecting the cells 410a and 410b.

Figure 5:
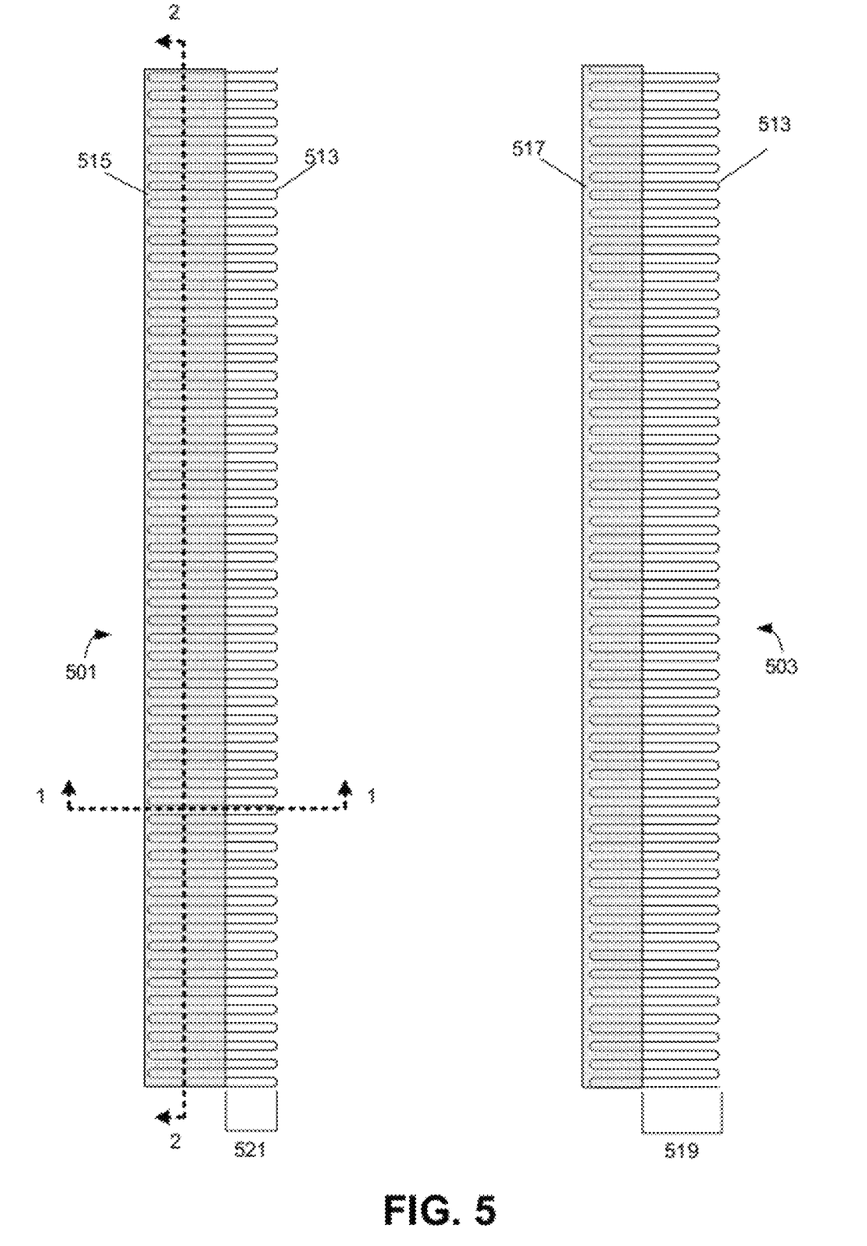
FIG. 5 depicts front and back views of a wire assembly according to certain embodiments.

In certain embodiments, the serpentine wire is provided on an insulating carrier, such as front and back decals described with reference to FIG. 1. FIG. 5 depicts front and back views of a strip of a wire assembly including serpentine wire 513 and front and back decals 515 and 517, respectively. Front view 501 shows serpentine wire 513 and front decal 515, which overlies a portion of wire 513. (Back decal 517 is not depicted in view 501 for clarity.) Exposed portion 521 of wire 513 interconnects the cell as depicted in FIG. 4. Back view 503 shows serpentine wire 513 and back decal 517, which overlies a portion of wire 513. Exposed portion 519 of wire 513 faces the top conducting oxide and acts as a current collector. In certain embodiments, such a wire assembly is affixed to the front side of a cell or cell width strip (such as those shown in FIG. 2). In alternate embodiments, one or more of the decals do not overlie the rounded end portions of the serpentine wire.

Figure 6:
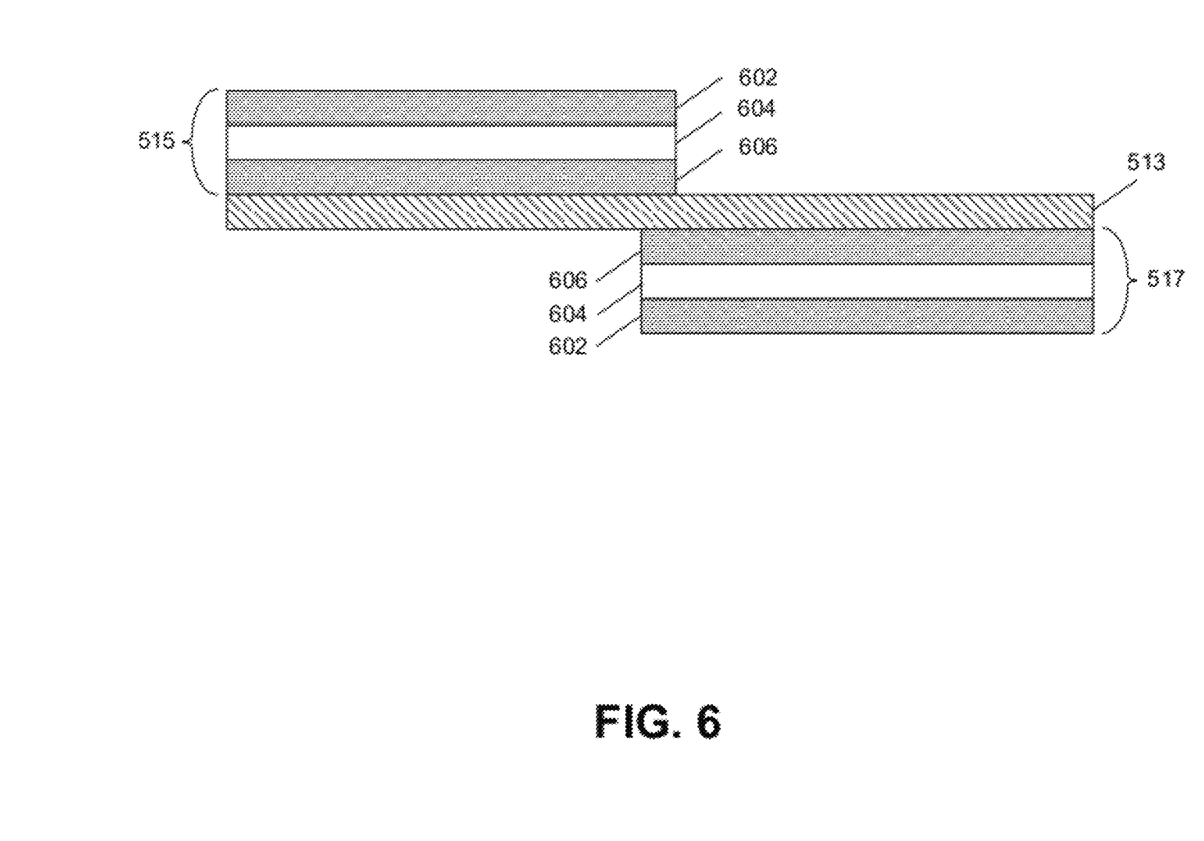
FIG. 6 depicts a cross-sectional view of a wire assembly according to certain embodiments.
Figure 7:
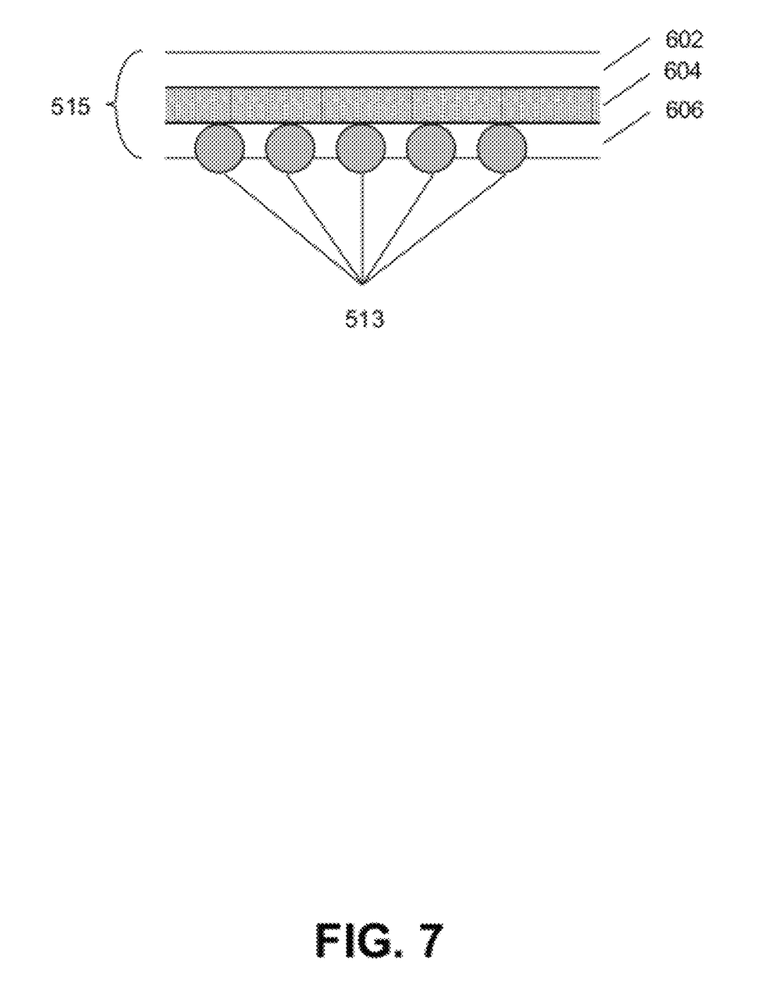
FIG. 7 depicts a cross-sectional view of a wire assembly according to certain embodiments.

FIG. 6 depicts a cross-sectional view of a wire assembly along line 1-1 of FIG. 5, according to certain embodiments. The wire assembly includes top decal 515, bottom decal 517, and serpentine wire 513. Top decal 515 and bottom decal 517 include first polymer film 602, second polymer film 604, and third polymer film 606. In some embodiments the first polymer film contacts the second polymer film and the second polymer film contacts the third polymer film. In other embodiments, there is a layer of adhesive between the first polymer film and the second polymer film. In further embodiments, there is a layer of adhesive between the second polymer film and the third polymer film. Note that FIG. 6 is a schematic representation of a wire assembly, and that in some embodiments, the serpentine wire is embedded in the third polymer film of the top decal and/or the bottom decal, as shown in FIG. 7, described below. In this embodiment, top decal 515 and bottom decal 517 include the same polymer film stacks, but in other embodiments, the top decal and the bottom decal have different polymer film stacks. Further, in some embodiments, one or both of the top decal and the bottom decal does not include first polymer 602. In FIG. 6, top decal 515 and bottom decal 517 overlap. In different embodiments, the amount of this overlap is variable, and in some embodiments, top decal 515 and bottom decal 517 do not overlap. The dimensions of the top decal (i.e., the thicknesses and widths of the first polymer film, the second polymer film, and the third polymer film) and the bottom decal are the same in some embodiments, and different in other embodiments.

FIG. 7 depicts a cross-sectional view of a wire assembly along line 2-2 of FIG. 5, according to certain embodiments. FIG. 7 shows top decal 515 and serpentine wire 513 embedded in third polymer film 606 of the top decal. Top decal 515 also includes first polymer film 602 and second polymer film 604. A surface of the wire facing away from second polymer film 604 is exposed. In some embodiments, the exposed surface of the wire makes electrical contact with a layer of material underlying the third polymer film. In this case, the exposed surface of the wire makes electrical contact with a transparent conducting oxide layer.

In certain embodiments, the polymer films are thermoplastic polymer films. For example, the polymer films may be thermoplastic polymer films such as polyethylene terephthalate (PET) films, poly(methyl methacrylate) (PMMA) films, fluorinated ethylene propylene (FEP) films, ethylene tetrafluoroethylene (ETFE) films, polycarbonate films, polyamide films, polyetheretherketone films (PEEK) films, low density polyethylene films, low density urethane films, or low density polymer (with ionomer functionality) films (e.g., poly(ethylene-co-methacrylic acid) (Surlyn™)). In some embodiments, the second polymer film is a polyethylene terephthalate (PET) film, a poly(methyl methacrylate) (PMMA) film, a fluorinated ethylene propylene (FEP) film, an ethylene tetrafluoroethylene (ETFE) film, or a polycarbonate film. The first polymer film and the third polymer film are the same type of polymer film in some embodiments, and in other embodiments, they are different types of polymer film. In some embodiments, the first and the third polymer films are a low density polyethylene film, a low density urethane film, or a low density polymer (with ionomer functionality) film. In a specific embodiment, the first and the third polymer films are films of poly(ethylene-co-methacrylic acid) (Surlyn™).

In some embodiments, the first, second, and third polymer films are thermoplastic polymer films, with the melting point temperature of the second thermoplastic polymer film being greater than the melting point temperatures of the first and the third polymer films. This difference in melting point temperatures allows the serpentine wire to be heated in the fabrication process of a wire assembly and be embedded in the third polymer film but not the second polymer film.

For example, in a specific embodiment, the third polymer film is a poly(ethylene-co-methacrylic acid) film and the second polymer film is a polyethylene terephthalate film. Polyethylene terephthalate has a melting point of greater than about 250° C., and poly(ethylene-co-methacrylic acid) has a melting point of about 90° C. These melting point temperatures vary with the processing and manufacturing methods of the polymer films. This difference in melting point temperatures allow a wire heated to about 120° C., for example, to be embedded in the third polymer film but not the second polymer film. The second polymer film acts as a barrier through which the heated wire will not pass. In some embodiments, the wire is in contact with the second polymer film, as depicted in FIG. 7; in other embodiments, the wire is not in contact with the second polymer film. In some embodiments there is a layer of adhesive between the poly(ethylene-co-methacrylic acid) film and the polyethylene terephthalate film. In some embodiments the layer of adhesive is a layer of polyurethane adhesive. In some embodiments the thickness of the layer of adhesive is about 0.5 microns to 10 microns.

In other embodiments the first polymer film and/or the third polymer film are an adhesive material. In other embodiments a non-polymeric adhesive material is used in place of the first polymer film and/or the third polymer film. In some of these embodiments, the adhesive material is a silicone-based polymer. Some examples of such adhesive materials include the following materials available from Dow Corning in Midland, Mich.: two part translucent heat cure adhesive (part number SE1700), and two part fast cure low modulus adhesive (part numbers JCR6115 and JCR 6140). In some embodiments the adhesive material is a thermoset polymer material. Examples of such adhesive materials include polyurethanes, epoxies, silicones, acrylics and/or combinations of these materials. A further example of such an adhesive material is a reactively functionalized polyolefin (e.g., with functional acrylate groups). In further embodiments the adhesive material has pressure sensitive adhesive characteristics and may be cross-linked with ultraviolet light, an electron beam, or thermal energy. In some embodiments, an advantage of an adhesive material that has pressure sensitive adhesive characteristics is that such an adhesive material does not rely on the thermal capacity of the wire in the fabrication process for a wire assembly; the adhesive material should have a sufficiently sticky formulation in these embodiments. A similar advantage is present for adhesive materials that are fast cure adhesives; the adhesive material should have a sufficiently fast cure time in these embodiments. Another advantage, in some embodiments, of adhesive materials that are thermoset polymer materials or materials that are cross-linked is that such materials are more resistant to flow at higher temperatures than thermoplastic polymer materials. This resistance to flow at higher temperatures also improves the adhesion of the wire to the adhesive material.

Figure 8:
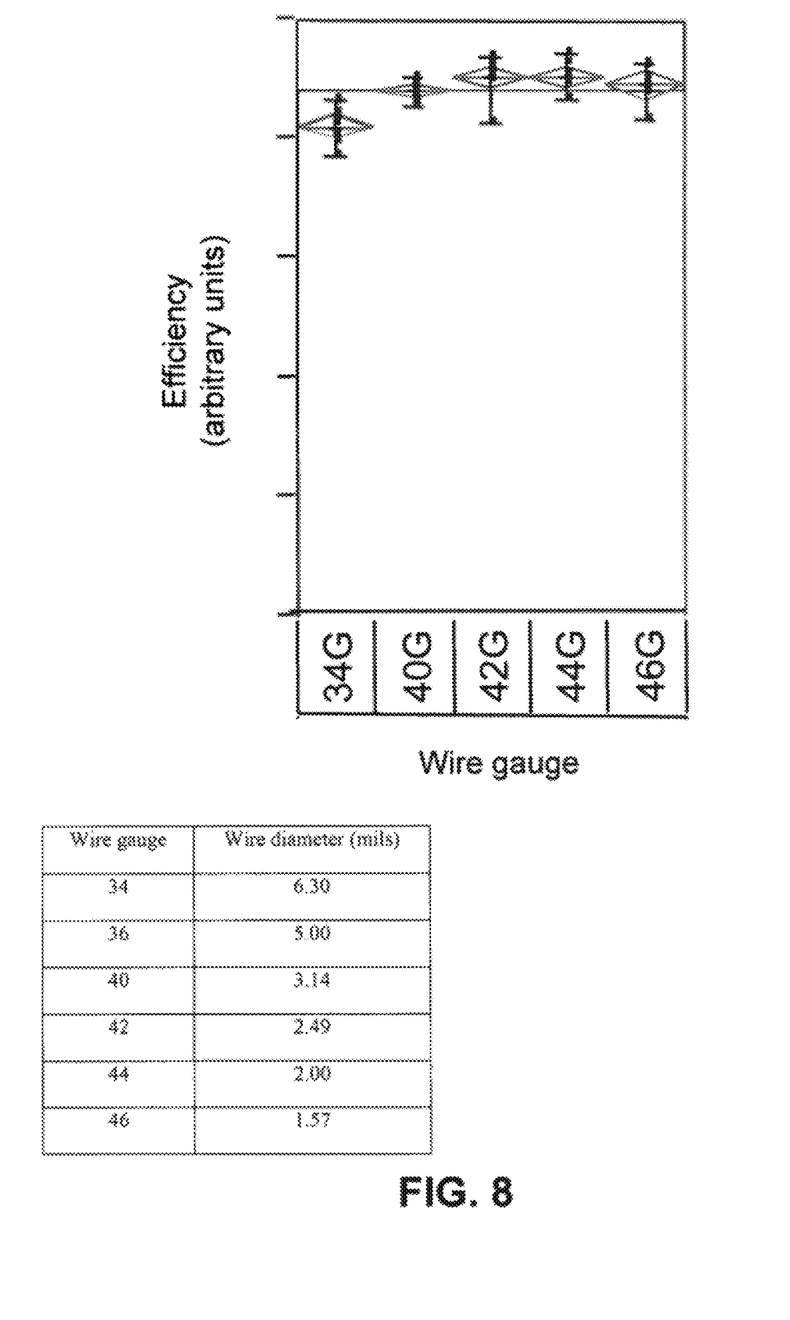
FIG. 8 is a plot depicting the efficiency of the solar cell versus the gauge of the wire in the wire assembly.

The efficiency (i.e., the power output) of the thin film solar cells incorporating the wire assemblies described above depends on a number of factors. With an increased area of the semiconductor materials not covered by the wire, the efficiency of a thin film solar cell increases. Thus, by increasing the gauge of the wire (with increasing wire gauge, the diameter of the wire decreases), the efficiency of the thin film solar cell increases. In some instances, an about 2 to 3% increase in efficiency has been observed by increasing the wire gauge. In other instances, an about 4 to 5% increase in efficiency has been observed. The effect of exposing more semiconductor material by increasing the wire gauge increases efficiency up to a certain point, however, and then efficiency decreases with increasing wire gauge, as shown in FIG. 8. This is due to decreased current collection with increasing wire gauge; electrons must travel a greater distance though the transparent conductive oxide of the thin film solar stack with increasing wire gauge, which decreases the efficiency due to an increased resistance. As shown in FIG. 8, efficiency increases from about 34 to 42 gauge, but then starts to decrease with further increasing wire gauge. Note that these efficiency measurements were made with solar cells with wire configured in a serpentine pattern with a specific pitch, and that changing the pitch would change the solar cell efficiency/wire gauge correlation.

Figure 9:
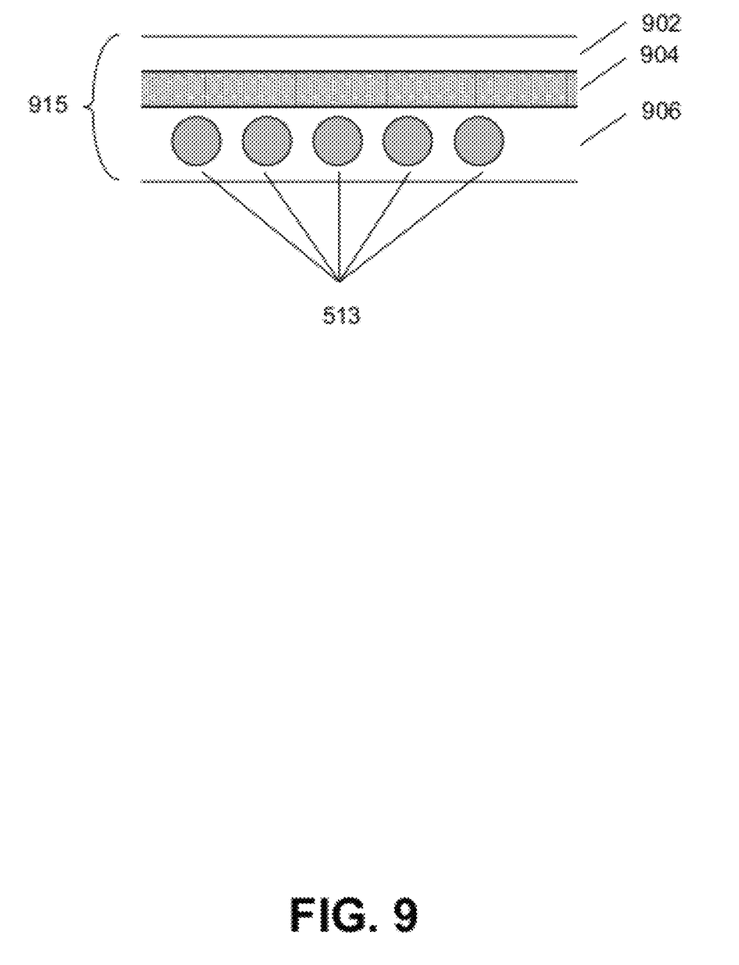
FIG. 9 depicts a cross-sectional view of a wire assembly in which the third polymer film is too thick.

Returning to FIG. 7, in order for surface of the wire facing away from the second polymer film to be exposed, the third polymer film is thin enough such that the wire is not completely encased in the third polymer film. For 34 gauge wire, a third polymer film with a thickness of about 2 mils accomplishes this. With higher gauge wire, however, a thinner third polymer film may be used. If the third polymer film is too thick, the wire may not contact the second polymer film and the wire may "float" in the third polymer film; i.e., if the third polymer film is too thick, a surface of the wire facing away from the second polymer film may not be exposed and therefore be unable to make electrical contact with a layer underlying the third polymer film. An example of the third polymer film being too thick is shown in FIG. 9. FIG. 9 depicts a cross-sectional view of a wire assembly, similar to cross-sectional view of the wire assembly shown in FIG. 7. In FIG. 9, however, the third polymer film is too thick. FIG. 9 shows decal 915 and serpentine wire 513 embedded in third polymer film 906 of the decal. Decal 915 also includes first polymer film 902 and second polymer film 904. Due to third polymer film 906 being too thick, however, a surface of the wire facing away from second polymer film 904 is not exposed. Due to the wire not being exposed, the wire would be unable to make electrical contact with any material underlying the third polymer. This might render a thin film solar cell unusable, depending on the configuration.

If the third polymer film is too thin, the wire may delaminate and become detached from the second polymer film. In certain embodiments, the thickness of the third polymer film is about ¼ to ½ the diameter of the wire in order to accomplish the above-described requirements. Further, using a thinner third polymer film reduces material costs.

In certain embodiments, when the wire is about 36 to 46 gauge, the third polymer film is about 0.5 to 1.5 mils thick. In a specific embodiment, the wire is about 40 gauge. In another specific embodiment in which the wire is about 40 gauge, the third polymer film is about 0.75 to 1.5 mils thick. In certain embodiments, the ratio of the thickness of the first polymer film, the second polymer film, and the third polymer film is between about 1:1:1 and 1:2:1.

In some embodiments, to fabricate a wire assembly when the third polymer film is a thermoplastic polymer, the wire is heated and contacted with a third polymer film that is part of a decal. The heated wire adheres to the thermoplastic. Further description of fabrication methods for wire assemblies is given in U.S. Provisional Patent Application No. 61/348,642, filed May 26, 2010, and entitled "APPARATUS AND METHOD FOR SECURING WIRE TO DECAL," which is incorporated by reference in its entirety. In other embodiments, to fabricate a wire assembly when the third polymer film is an adhesive material, the wire is contacted with an adhesive material that is part of a decal. The wire adheres to the adhesive material. In embodiments where the adhesive material is thermoset polymer or a material that cross-links/cures, the adhesive material is exposed to ultraviolet light, an electron beam, or a heat source to cross-link and/or cure the adhesive material.

Using a higher gauge wire and a thinner third polymer film introduces challenges in the fabrication of the wire assemblies. One challenge is with different fabrication techniques when using thermoplastics such as poly(ethylene-co-methacrylic acid) (Surlyn™) for the third film. For example, when producing a poly(ethylene-co-methacrylic acid) film with a thickness of about 2 mils, a blown film extrusion process may be used. In a blown film extrusion process, a polymer is extruded through a die configured as an upright cylinder with a circular opening. As the polymer is extruded, compressed air may be forced into the center of the extruded cylindrical profile, created a bubble. The bubble is then collapsed onto itself to form a thin sheet of polymer. It is difficult, however, to reproducibly produce poly(ethylene-co-methacrylic acid) films thinner than about 2 mils using a blown film process.

In order to reproducibly produce poly(ethylene-co-methacrylic acid) films thinner than about 2 mils, an extrusion coating process is used. In an extrusion coating process, an additional layer of one polymer is coated onto an existing film. In a process of producing a poly(ethylene-co-methacrylic acid) film on a polyethylene terephthalate film, according to embodiments described herein, poly(ethylene-co-methacrylic acid) is extruded through a die onto a polyethylene terephthalate film. The configuration of the die is used to control the thickness of the poly(ethylene-co-methacrylic acid) film. The two film structure may then be passed through cold rollers. Extrusion coating may be used to reproducibly produce poly(ethylene-co-methacrylic acid) films down to about ½ mil thickness.

Another challenge is handling the high gauge wire itself. Higher gauge wire is thinner, and has a lower yield strength than thicker wire. For example, the yield strength of 34 gauge wire used in some embodiments is about 4 times higher than the yield strength of 40 gauge wire used in other embodiments. The lower yield strength of the higher gauge wire presents challenges in forming it into a serpentine pattern. Further, thinner wire has a lower thermal capacity than thicker wire. The lower thermal capacity presents challenges in embedding the wire in a thermoplastic polymer film due to the wire cooling off rapidly after it is heated. In order to meet the challenges of handling high gauge wire, modifications to the fabrication process may be made. For example, the fabrication process may be modified such that less stress is put on higher gauge wire so that it does not yield. As another example, higher gauge wire may be heated to higher temperatures (e.g., with additional or more powerful heating zones in the fabrication process) such that when the wire cools, it is still at a high enough temperature to be embedded in a thermoplastic polymer film.

Although the foregoing invention has been described in some detail for purposes of clarity of understanding, it will be apparent that certain changes and modifications may be practiced within the scope of the invention. It should be noted that there are many alternative configurations of the wire assemblies of the present invention. Accordingly, the present embodiments are to be considered as illustrative and not restrictive, and the invention is not to be limited to the details given herein.

What is claimed is:

1. A wire assembly for a solar cell, comprising:
   a wire; and
   a decal, the decal comprising:
      a first polymer film, wherein a thickness of the first polymer film is about 0.5 to 2 mils,
      a second polymer film proximate to the first polymer film,
      a third polymer film that directly physically contacts the first polymer film, wherein the first polymer film is interposed between the second polymer film and the third polymer film, and
      an outer surface, wherein:
         the wire is embedded in the second polymer film such that a surface of the wire that is facing away from the first polymer film extends past the outer surface of the decal,
         a gauge of the wire is about 36 to 46 gauge,
         a thickness of the second polymer film is about ¼ to ½ a diameter of the wire and about 0.5 to 1.5 mils,
         the wire is not embedded in the first polymer film,
         the decal is a wire carrier,
         the wire assembly is configured to be placed as a discrete unit on the solar cell, and
         the first polymer film, the second polymer film, and the third polymer film have the same length and width.

2. The wire assembly of claim 1, wherein the thickness of the first polymer film, the thickness of the second polymer film, and a thickness of the third polymer film have a ratio of about 1:1:1 to 2:1:1.

3. The wire assembly of claim 1, wherein the second polymer film comprises a polymer selected from the group consisting of a low density polymer with ionomer functionality, a thermoset, and a pressure sensitive adhesive.

4. The wire assembly of claim 1, wherein the second polymer film comprises a low density polymer with ionomer functionality.

5. The wire assembly of claim 1, wherein the second polymer film comprises poly(ethylene-co-methacrylic acid).

6. The wire assembly of claim 1, wherein the second polymer film comprises a first thermoplastic polymer film.

7. The wire assembly of claim 6, wherein the first polymer film comprises a second thermoplastic polymer film, and wherein a melting temperature of the second thermoplastic polymer film is greater than a melting temperature of the first thermoplastic polymer film.

8. The wire assembly of claim 1, wherein the first polymer film comprises a polymer selected from the group consisting of polyethylene terephthalate, poly(methyl methacrylate), fluorinated ethylene propylene, ethylene tetrafluoroethylene, and polycarbonate.

9. The wire assembly of claim 1, wherein the first polymer film is in contact with a surface of the wire that is facing towards the first polymer film.

10. The wire assembly of claim 1, wherein the gauge of the wire is about 40 gauge.

11. The wire assembly of claim 1, wherein the surface of the wire extends past the outer surface of the decal is configured to make electrical contact with layers overlaying the second polymer film.

12. The wire assembly of claim 1, wherein the wire is configured in a serpentine pattern.

13. The wire assembly of claim 1, wherein the wire is configured in a pattern in which the wire spans a length of the decal and traverses an edge of the decal along the length of the decal.

14. A wire assembly for a solar cell, comprising:
    a wire; and
    a decal, the decal comprising:
       a first layer of a film comprising poly(ethylene-co-methacrylic acid);
       a layer of a polyethylene terephthalate film proximate to the first layer, wherein a thickness of the polyethylene terephthalate film is about 2 mils;
       a second layer of a film comprising poly(ethylene-co-methacrylic acid) that directly physically contacts the layer of the polyethylene terephthalate film, wherein the layer of the polyethylene terephthalate film is interposed between the first layer and the second layer; and
       an outer surface, wherein:
          the wire is embedded in the second layer such that a surface of the wire that is facing towards the polyethylene terephthalate film is in contact with the polyethylene terephthalate film and a surface of the wire that is facing away from the polyethylene terephthalate film extends past the outer surface of the decal,
          a gauge of the wire is about 40 gauge,
          a thickness of the second layer is about 0.75 to 1.5 mils,
          the wire is not embedded in the layer of the polyethylene terephthalate film,
          the decal is a wire carrier, and
          the wire assembly is placed as a discrete unit on the solar cell and is configured to be placed as a discrete unit on the solar cell, and
          the first polymer film, the second polymer film, and the third polymer film have the same length and width.

15. The wire assembly of claim 14, wherein a thickness of the first layer, a thickness of the polyethylene terephthalate film, and a thickness of the second layer have a ratio of about 1:1:1 to 1:2:1.

16. The wire assembly of claim 1, wherein the melting temperature of the first polymer film is different than the melting temperature of the second polymer film.

17. The wire assembly of claim 1, wherein the melting temperature of the first polymer film is greater than the melting temperature of the second polymer film.

18. A wire assembly for a solar cell, comprising:
    a wire; and
    a decal, the decal comprising:
       a first polymer film, wherein a thickness of the first polymer film is about 0.5 to 2 mils,
       a second polymer film proximate to the first polymer film,
       a third polymer film that directly physically contacts the first polymer film, wherein the first polymer film is interposed between the second polymer film and the third polymer film, and
       an outer surface, wherein:
          the wire is embedded in the second polymer film such that a surface of the wire that is facing away from the first polymer film extends past the outer surface of the decal,
          the wire is not embedded in the first polymer film,
          the wire assembly is configured to be placed as a discrete unit on the solar cell, and the first polymer film, the second polymer film, and the third polymer film have the same length and width.

* * * * *